(12) United States Patent
Shoham et al.

(10) Patent No.: US 7,257,672 B2
(45) Date of Patent: Aug. 14, 2007

(54) ERROR PROTECTION FOR LOOKUP OPERATIONS PERFORMED ON TERNARY CONTENT-ADDRESSABLE MEMORY ENTRIES

(75) Inventors: Doron Shoham, Shoham (IL); Earl T. Cohen, Oakland, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/280,792

(22) Filed: Nov. 16, 2005

(65) Prior Publication Data

US 2006/0080498 A1  Apr. 13, 2006

Related U.S. Application Data

(63) Continuation-in-part of application No. 10/879,254, filed on Jun. 29, 2004.

(51) Int. Cl.
*G06F 12/00* (2006.01)

(52) U.S. Cl. .................. 711/108; 711/128; 711/158; 714/6; 370/392; 365/49

(58) Field of Classification Search ............... 711/108, 711/128, 158; 714/6; 370/392; 365/49
See application file for complete search history.

(56) References Cited

U.S. PATENT DOCUMENTS

| | | | | |
|---|---|---|---|---|
| 4,168,486 A | 9/1979 | Legory | ...................... | 714/759 |
| 4,692,922 A | 9/1987 | Kiriu et al. | ................... | 714/777 |
| 4,740,968 A | 4/1988 | Aichelmann, Jr. | ........... | 714/703 |
| 4,852,100 A | 7/1989 | Christensen et al. | ........ | 714/763 |
| 5,313,475 A | 5/1994 | Cromer et al. | .............. | 714/758 |
| 5,379,304 A | 1/1995 | Dell et al. | ................... | 714/758 |
| 5,842,040 A | 11/1998 | Hughes et al. | ................ | 710/11 |
| 5,845,324 A | 12/1998 | White et al. | ................. | 711/128 |
| 6,181,698 B1 | 1/2001 | Hariguchi | .................... | 370/392 |
| 6,295,576 B1 | 9/2001 | Ogura et al. | ................ | 711/108 |
| 6,307,855 B1 | 10/2001 | Hariguchi | .................... | 370/392 |
| 6,374,326 B1 | 4/2002 | Kansal et al. | ................ | 711/108 |
| 6,377,577 B1 | 4/2002 | Bechtolsheim et al. | ...... | 370/392 |
| 6,385,071 B1 | 5/2002 | Chai et al. | ..................... | 365/49 |
| 6,389,506 B1 | 5/2002 | Ross et al. | ................... | 711/108 |
| 6,467,019 B1 | 10/2002 | Washburn | .................... | 711/108 |
| 6,510,509 B1 | 1/2003 | Chopra et al. | ................. | 712/13 |

(Continued)

OTHER PUBLICATIONS

U.S. Appl. No. 09/910,227, filed Jul. 20, 2001, Mark Ross.

(Continued)

*Primary Examiner*—Stephen C. Elmore
(74) *Attorney, Agent, or Firm*—The Law Office of Kirk D. Williams (57) ABSTRACT

Lookup operations are performed on ternary content-addressable memory (TCAM) entries, with error protection provided. Groups of TCAM entries are programmed such that each of its entries differ by more than a predetermined calculated count of ones distance of k bits, where k>0. Lookup operations are performed on these entries using a lookup word in a manner to detect k or less differences in entries within groups to identify a matching entry or no matching entry from each group. These matching entries are then verified using a corresponding error code to identify which entries are a full hit, a suspected hit, or a miss. One of the full and suspected hits is determined in a predetermined manner and identified as the lookup result (or a miss is the lookup result if there are no such entries).

23 Claims, 7 Drawing Sheets

U.S. PATENT DOCUMENTS

| | | | |
|---|---|---|---|
| 6,526,474 B1 | 2/2003 | Ross | 711/108 |
| 6,535,951 B1 | 3/2003 | Ross | 711/108 |
| 6,597,595 B1 | 7/2003 | Ichiriu et al. | 365/49 |
| 6,606,681 B1 | 8/2003 | Uzun | 711/108 |
| 6,618,281 B1 | 9/2003 | Gordon | 365/49 |
| 6,643,260 B1 | 11/2003 | Kloth et al. | 370/235 |
| 6,651,096 B1 | 11/2003 | Gai et al. | 709/223 |
| 6,658,002 B1 | 12/2003 | Ross et al. | 370/392 |
| 6,658,458 B1 | 12/2003 | Gai et al. | 709/215 |
| 6,678,786 B2 | 1/2004 | Srinivasan et al. | 711/108 |
| 6,687,144 B2 | 2/2004 | Batson et al. | 365/49 |
| 6,715,029 B1 | 3/2004 | Trainin et al. | 711/108 |
| 6,717,946 B1 | 4/2004 | Hariguchi et al. | 370/392 |
| 6,725,326 B1 | 4/2004 | Patra et al. | 711/108 |
| 6,728,124 B1 | 4/2004 | Ichriu et al. | 365/49 |
| 6,732,227 B1 | 5/2004 | Baumann | 711/108 |
| 6,738,862 B1 | 5/2004 | Ross et al. | 711/108 |
| 6,775,737 B1 | 8/2004 | Warkhede et al. | 711/108 |
| 6,862,281 B1 | 3/2005 | Chandrasekaran | 370/392 |
| 6,871,262 B1 | 3/2005 | Oren et al. | 711/108 |
| 6,871,265 B1 | 3/2005 | Oren et al. | 711/128 |
| 6,961,808 B1 | 11/2005 | Oren et al. | 711/108 |
| 6,970,971 B1 | 11/2005 | Warkhede et al. | 711/108 |
| 2003/0005146 A1 | 1/2003 | Miller et al. | 709/238 |
| 2003/0231631 A1 | 12/2003 | Pullela | 370/392 |
| 2004/0015752 A1 | 1/2004 | Patella et al. | 714/718 |
| 2004/0015753 A1 | 1/2004 | Patella et al. | 714/718 |
| 2004/0030802 A1 | 2/2004 | Eatherton et al. | 709/245 |
| 2004/0030803 A1 | 2/2004 | Eatherton et al. | 709/245 |
| 2004/0100950 A1 | 5/2004 | Basu et al. | 370/389 |
| 2004/0170171 A1 | 9/2004 | Kanekar et al. | 370/392 |
| 2004/0170172 A1 | 9/2004 | Pullela et al. | 370/392 |
| 2004/0172346 A1 | 9/2004 | Kanekar et al. | 705/30 |
| 2005/0010612 A1 | 1/2005 | Enderwick et al. | 707/201 |
| 2005/0010719 A1* | 1/2005 | Slavin | 711/108 |
| 2005/0114602 A1 | 5/2005 | Ngai et al. | 711/128 |
| 2005/0157712 A1 | 7/2005 | Rangaranjan et al. | 370/388 |

OTHER PUBLICATIONS

U.S. Appl. No. 10/813,210, Mar. 29, 2004, Ashwath Nagaraj.
U.S. Appl. No. 11/040,678, filed Jan. 22, 2005, Oded Trainin.
U.S. Appl. No. 11/252,960, filed Oct. 18, 2005, Krishnan et al.
Mcauley et al., "Fast Table Lookup Using CAMs," Networking: Foundation for the Future, IEEE, vol. 3, pp. 1382-1391, Mar. 28-Apr. 1, 1993.

* cited by examiner

ERROR PROTECTION FOR LOOKUP OPERATIONS PERFORMED ON TERNARY CONTENT-ADDRESSABLE MEMORY ENTRIES

CROSS-REFERENCE TO RELATED APPLICATIONS

This is a continuation-in-part of copending nonprovisional Application No. 10/879,254, filed Jun. 29, 2004, which is hereby incorporated by reference in its entirety.

TECHNICAL FIELD

One embodiment of the invention relates to communications and computer systems, especially networked routers, packet switching systems, and other devices; and more particularly, one embodiment relates to error protection for lookup operations performed on ternary content-addressable memory entries.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP). Note, nothing described or referenced in this document is admitted as prior art to this application unless explicitly so stated.

A network device, such as a switch or router, typically receives, processes, and forwards or discards a packet based on one or more criteria, including the type of protocol used by the packet, addresses of the packet (e.g., source, destination, group), and type or quality of service requested. Additionally, one or more security operations are typically performed on each packet. But before these operations can be performed, a packet classification operation must typically be performed on the packet.

Packet classification as required for, inter alia, access control lists (ACLs) and forwarding decisions, is a demanding part of switch and router design. The packet classification of a received packet is increasingly becoming more difficult due to ever increasing packet rates and number of packet classifications. For example, ACLs require matching packets on a subset of fields of the packet flow label, with the semantics of a sequential search through the ACL rules. IP forwarding requires a longest prefix match.

Known approaches of packet classification include using custom application-specific integrated circuits (ASICs), custom circuitry, software or firmware controlled processors, and associative memories, including, but not limited to binary content-addressable memories (binary CAMs) and ternary content-addressable memories (ternary CAMs or TCAMs). Each entry of a binary CAM typically includes a value for matching against, while each TCAM entry typically includes a value and a mask. The associative memory compares a lookup word against all of the entries in parallel, and typically generates an indication of the highest-priority entry that matches the lookup word. An entry matches the lookup word in a binary CAM if the lookup word and the entry value are identical, while an entry matches the lookup word in a TCAM if the lookup word and the entry value are identical in the bits that are not indicated by the mask as being irrelevant to the comparison operations.

Associative memories are very useful in performing packet classification operations. As with most any system, errors can occur. For example, array parity errors can occur in certain content-addressable memories as a result of failure-in-time errors which are typical of semiconductor devices.

When a packet classification lookup operation is performed on an associative memory with corrupted entries, a bit error in an entry can result in a false hit, or a false miss. A false hit occurs when the corrupted value of an entry matches the lookup value when it otherwise would not match that entry (and thus another entry or no entry should have been matched). A false miss occurs when an entry should have been matched except for the corruption in the entry. This could result in no entry being matched or another lower-priority entry being matched. When these lookup operations are used for packet classification, an incorrect match or miss presents a problem especially when identifying a route or performing a security classification.

Error-correcting and error-detecting codes are well-known. For example, ANDREW S. TANENBAUM, Computer Networks, Prentice-Hall, 1981, pp. 125-132, discusses error-correcting and error-detecting codes, and is hereby incorporated by reference. Assume a codeword contains n bits of which m are data bits and r are error-correcting or error-detecting bits (e.g., redundant or check bits), with n=m+r. There are many well-known ways to generate the error-detecting and error-correcting bits. Given two codewords, it is possible to determine how many bits differ (e.g., by exclusively-OR'ing or one bit summing the corresponding bits of the two codewords and summing these results). The number of bit positions in which two codewords or a set of codewords differ is called the Hamming distance. A Hamming distance of d, means that it will require d single-bit errors to convert one codeword to another codeword. To detect j errors, a Hamming distance of j+1 is required because with such a code, there is no way that j single-bit errors can change a valid codeword into another valid codeword. Similarly, to correct j errors, a distance 2j+1 code is required because that way the legal codewords are so far apart that even with j changes, the original codeword is still closer than any other codeword, so it can be uniquely determined.

A prior approach protects the associative memory entries with error detection or correction values when the associative memory is not being used to perform a lookup operation. For example, using a background operation, the associative memory entries are periodically checked and corrected for errors (e.g., read from their location and if in error, the correct value is written back). Another prior approach is to periodically over write each associative memory entry with the correct value. These and other prior approaches do not immediately detect the error, nor detect the error when a lookup operation is performed on the corrupted entry. Thus, there can be significant periods (e.g., several seconds to minutes which can be a very long time in the context of a packet switch) before such corrupted entry is corrected.

Some random access memories (RAMs) add error-correcting or error-detecting codes to each memory cell. As part of a read operation of a memory location, the data portion and the error-correcting or error-detecting code is read, which is then used to detect a possible error and/or correct a discovered error in the data portion. This is especially convenient to do as only one set of error-detecting/error correcting circuitry is required (i.e., to operate on the data read from the specified memory location). However, this approach is impractical for an associative memory, as each associative memory entry would need this complete circuitry, and the result of the error-corrected operation for each memory location would need to be compared to the lookup word for every lookup operation. Desired is a mechanism to reduce or eliminate the possible false hits or misses due to corrupted associative memory entries.

SUMMARY

Disclosed are, inter alia, methods, apparatus, computer-readable media, mechanisms, and means for providing error protection for lookup operations performed on ternary content-addressable memory (TCAM) entries. A highest-priority matching entry among multiple ternary content-addressable entries, if any, is identified. Each of these entries includes a value and a mask, and is associated with at least one error code (i.e., an error detection or correction code). Groups of these entries each include at least one entry. Each entry in a group of entries having at least two entries differs in a count of ones from every other entry in the same group of entries by more than k, wherein k is an integer greater than zero. For each particular group of entries, a highest-priority possible hit entry is determined (or a miss) based on a lookup word. For each determined particular highest-priority possible hit entry (one per group with a matching entry), whether or not the particular highest-priority possible hit entry is a candidate for being the overall highest-priority matching entry is determined in part based on the error code associated with the particular highest-priority possible hit entry. The overall highest-priority entry from the determined candidate entries is identified. Processing of information, such as a packet, is then typically performed based on the result of the lookup operation (e.g., the highest-priority matching entry or a miss).

In other words, k is a maximum distance between two entries such that despite bit errors in the entries, a full hit or suspected hit can be identified. For example, the case of k=0 corresponds to a conventional TCAM's identification of a hit when all non-masked bit positions of an entry completely match a lookup word. For example, if k=1, then all entries differ from each other in a group of entries by at least two bits; and therefore, a single bit error on an entry that otherwise would have fully matched a particular lookup word can still be identified as potentially matching the particular lookup word as it will differ in a count of ones by one (which is less than the distance of at least two between all entries in the group). Thus, if there are no bit errors, then at most one entry will match in a group of entries. If there is at least one bit error in an entry in the group of entries, then there may be multiple matching entries identified by the count of ones being less than or equal to k for each entry. If the count of ones when doing a lookup operation is greater than k for an entry, then the entry is considered as a miss. Further manipulation using the error code of the corresponding entry identifies whether the identified possible matching entry is a full hit (e.g., no bit errors and matching all bit positions—i.e., its count of ones for the lookup operation equals zero) or a suspected hit (e.g., an identified error and identified as possibly matching), else a miss.

In one embodiment, the count of ones between two entries is determined based on a count of the bits having a value of one in a result of ANDing the exclusive-OR result of these two values with the result of ANDing these two masks (i.e., a count of the different bits in any positions not masked in either entry). In one embodiment, k is one. In one embodiment, k is greater than one. One embodiment identifies whether the highest-priority matching entry is a full hit (e.g., the count of ones is zero and no error detected) or a suspected hit (the count of ones is less than or equal to k with an error being detected). One embodiment determines the placement of entries in the groups of entries in order to guarantee that each entry in each particular group (having at least two entries) differs in a count of ones from every other entry in the same particular group by more than k. In order to achieve this distance of k, one embodiment maps one or more original values into values stored in the entries (with the same mapping performed to one or more fields of deriving the lookup word prior to the lookup operation).

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

Disclosed are, inter alia, methods, apparatus, computer-readable media, mechanisms, and means for providing error protection for lookup operations performed on ternary content-addressable memory (TCAM) entries.

Note, embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations. Note, computer-readable media and means for performing methods and processing block operations are disclosed and are in keeping with the extensible scope and spirit of the invention.

As used herein, the term "packet" refers to packets of all types or any other units of information or data, including, but not limited to, fixed length cells and variable length packets, each of which may or may not be divisible into smaller packets or cells. The term "packet" as used herein also refers to both the packet itself or a packet indication, such as, but not limited to all or part of a packet or packet header, a data structure value, pointer or index, or any other part or direct or indirect identification of a packet or information associated therewith. For example, often times a router operates on one or more fields of a packet, especially the header, so the body of the packet is often stored in a separate memory while the packet header is manipulated, and based on the results of the processing of the packet (i.e., the packet header in this example), the entire packet is forwarded or dropped, etc. Additionally, these packets may contain one or more types of information, including, but not limited to, voice, data, video, and audio information. The term "item" is used generically herein to refer to a packet or any other unit or piece of information or data, a device, component, element, or any other entity. The phrases "processing a packet" and "packet processing" typically refer to performing some steps or actions based on the packet contents (e.g., packet header or other fields), and such steps or action may or may not include modifying, storing, dropping, and/or forwarding the packet and/or associated data.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process the value, the value must be obtained prior to processing it, although some of the associated processing may be performed prior to, concurrently with, and/or after the read operation). Furthermore, the term "identify" is used generically to describe any manner or mechanism for directly or indirectly ascertaining something, which may include, but is not limited to receiving, retrieving from memory, determining, defining, calculating, generating, etc.

Moreover, the terms "network" and "communications mechanism" are used generically herein to describe one or more networks, communications media or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The term "message" is used generically herein to describe a piece of information which may or may not be, but is typically communicated via one or more communication mechanisms of any type.

The term "storage mechanism" includes any type of memory, storage device or other mechanism for maintaining instructions or data in any format. "Computer-readable medium" is an extensible term including any memory, storage device, storage mechanism, and other storage mechanisms. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed by a processing element and/or control logic, and data which is manipulated by a processing element and/or control logic. The term "data structure" is an extensible term referring to any data element, variable, data structure, database, and/or one or more organizational schemes that can be applied to data to facilitate interpreting the data or performing operations on it, such as, but not limited to memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to a reference to a memory or other storage mechanism or location therein, an index in a data structure, a value, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the phrase "means for xxx" typically includes computer-readable medium containing computer-executable instructions for performing xxx.

In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Additionally, the use of a singular tense of a noun is non-limiting, with its use typically including one or more of the particular thing rather than just one (e.g., the use of the word "memory" typically refers to one or more memories without having to specify "memory or memories," or "one or more memories" or "at least one memory", etc.). Moreover, the phrases "based on x" and "in response to x" are used to indicate a minimum set of items x from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. Moreover, the term "or" is used herein to identify a selection of one or more, including all, of the conjunctive items.

Disclosed are, inter alia, methods, apparatus, computer-readable media, mechanisms, and means for providing error protection for lookup operations performed on ternary content-addressable memory (TCAM) entries. Each of these entries includes a value and a mask, and is associated with at least one error code. Note, as used herein, the term "error code" refers to an error detection or correction code for identifying (and possibly for correcting) one or more bit errors in a TCAM entry. Groups of these entries each include at least one entry. Each entry in each group having at least two entries differ in a count of ones from each other entry by more than k, wherein k is an integer greater than zero. One way the count of ones between two entries can determined is based on a count of the bits having a value of one in a result of ANDing the exclusive-OR result of these two values with the result of ANDing these two masks (i.e., a count of the different bits in any positions not masked in either entry). Groups of TCAM entries are programmed such that each of its entries differs by more than a predetermined calculated count of ones distance of k bits from every other entry in the same group of entries, where k>0. Lookup operations are performed on these entries using a lookup word in a manner to detect k or less differences in entries within groups to identify a matching entry or no matching entry from each group. These matching entries are then verified using a corresponding error code to identify which entries are a full hit, a suspected hit, or a miss. One of the full and suspected hits is determined in a predetermined manner and identified as the lookup result for that group (or a miss is identified as the lookup result if there are no such entries).

In other words, k is a maximum distance between two entries such that despite bit errors in the entries, a full hit or suspected hit will be identified in one embodiment. For example, the case of k=0 corresponds to a conventional TCAM's identification of a hit when all non-masked bit positions of an entry completely match a lookup word. For example, if k=1, then all entries differ from each other in a group of entries by at least two unmasked bit positions; and therefore, a single bit error on an entry that otherwise would have fully matched a particular lookup word can still be identified as potentially matching the particular lookup word as it will differ in a count of ones by one (which is less than the distance of at least two between all entries in the group). In one embodiment, k is one; while in one embodiment, k is greater than one.

The number of TCAM entries in a group of entries typically varies depending on the operation and/or implementation requirements of an embodiment. If space, power, or other concerns may not be an issue for one embodiment, then it may be preferable to have a single entry per group of entries as this removes a programming limitation for the TCAM entries, as, by default, there will always be the required amount of count of ones distance between other entries in the group because there are no other entries in the group. However, the logic to perform the error detection requires space and possibly other resources. Therefore, one embodiment allocates multiple entries per group, and typically shares the error detection logic among the group members. However, this presents a limitation on the entries which may be placed in a group, as the entries in each group typically are required to have a minimum count of ones distance of k bits from all other entries in the group, where k>0. Therefore, in one embodiment, entries are mapped from there original values into other values to provide the necessary distance, with this same mapping being applied to values in the lookup words used to search the entries.

One embodiment identifies a highest priority matching entry in a ternary content-addressable memory. The ternary content-addressable memory includes multiple entries, each of these entries includes a value and a mask and is associated with at least one error code. These entries are grouped into multiple groups of entries, with all entries in each of the groups including at least two entries differ in a count of ones from every other entry in the same group by more than k, wherein k is an integer greater than zero. For each particular group of entries, a highest priority possible hit entry for the particular group, if any, is determined for a lookup word. For each particular highest priority possible hit entry of the determined highest priority possible hit entries, it is determined whether or not the particular highest priority possible hit entry is a candidate for being the highest-priority matching entry based on the error code associated with it. The highest-priority matching entry is determined (and typically communicated to another device) from the determined candidate entries. One embodiment includes determining the lookup word based on one or more fields of a received packet; and processing said received packet based on said highest-priority matching entry identified based on the lookup word.

In one embodiment, the error code is an error-correcting code. In one embodiment, the error code is parity. In one embodiment, each of the group of entries comprises a single different one of said entries. In one embodiment, each of the groups of entries includes multiple entries such that no entry is in more than one of the groups of entries. In one embodiment, k is one. In one embodiment, k is greater than one. One embodiment includes communicating an indication of said identified highest-priority matching entry and an indication of whether said identified highest-priority matching entry was determined to be a hit or a suspected hit.

In one embodiment, the count of ones between two entries is determined based on a count of the bits having a value of one in a result of ANDing the exclusive-OR result of said values of said two entries with the result of ANDing said masks of said two entries. In one embodiment, a particular entry is a possible hit entry if k is greater than or equal to a count of the bits having a value of one in a result of ANDing said mask of the particular entry with the exclusive-OR result of said value of the particular entry and the lookup word. In one embodiment, the particular highest-priority possible hit entry is a candidate for being the highest-priority matching entry if it is a hit or a suspected hit, else it is not a candidate. In one embodiment, a hit is when all bit positions of said value of the said particular highest-priority possible hit entry not masked by said mask of the said particular highest-priority possible hit entry completely match corresponding bit positions in the lookup word with no error detected on said particular highest-priority possible hit entry based on said error code associated with said particular highest-priority possible hit entry, and wherein a suspected hit is when an error is detected on said particular highest-priority possible hit entry based on said error code associated with said particular highest-priority possible hit entry and a count of the bits having a value of one in a result of ANDing said mask of said particular highest-priority possible hit entry with the exclusive-OR result of said value of said particular highest-priority possible hit entry and the lookup word is less than or equal to k.

One embodiment includes determining the placement of entries in the ternary content-addressable memory in order to guarantee that all said entries in each particular group of the plurality of groups of said entries which includes a plurality of entries differ in a count of ones from every other entry in the particular group by more than k. One embodiment includes mapping original values for one or more of said entries in a specific group of said groups of entries into said values for said one or more of said entries in the specific group in order to change the count of ones between at least two of said entries in the specific group.

One embodiment includes an apparatus configured to identify a highest-priority matching entry, with the apparatus comprising: a multiple groups of ternary content-addressable memory entries, each of these entries includes a value, a mask and at least one error code; and logic configured to perform a lookup operation on the groups of ternary content-addressable memory entries based on a lookup word to determine the highest-priority matching entry. The lookup operation includes: (a) for each particular group of said groups of entries, determining a highest-priority possible hit entry in the particular group, if any, for the lookup word; (b) for each particular highest-priority possible hit entry of the determined highest-priority possible hit entries, determining whether or not the particular highest-priority possible hit entry is a candidate for being the highest-priority matching entry based on the error code of said particular highest-priority possible hit entry, wherein said particular highest-priority possible hit entry is a candidate for being the highest-priority matching entry if it is a hit or a suspected hit, else it is not a candidate; and (c) determining a highest-priority candidate entry from said determined candidate entries.

Figure 1A:
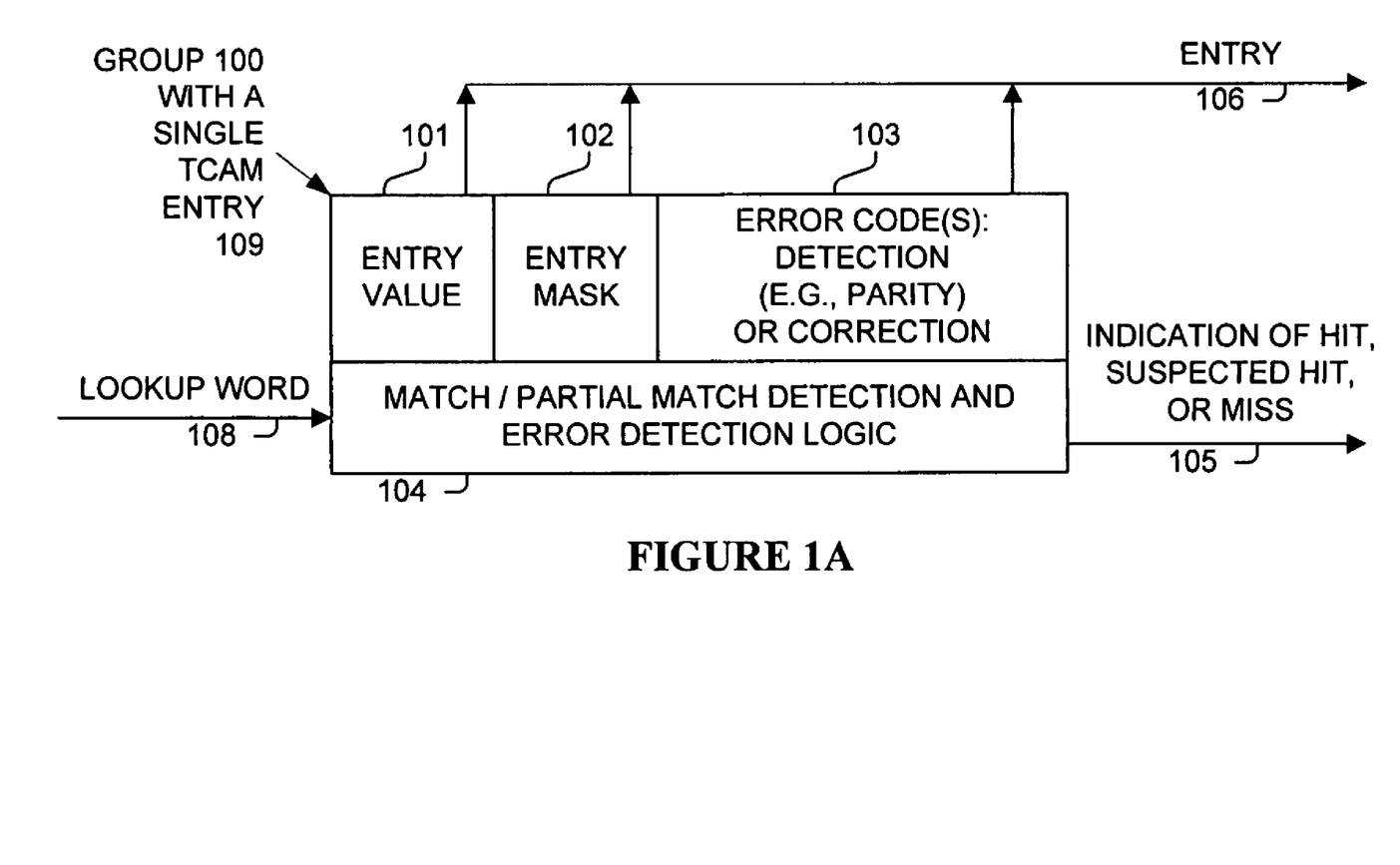
FIGS. 1A-C are block diagrams illustrating a few of an extensible number of different ternary content-addressable memory entries and logic for performing lookup operations.

FIG. 1A illustrates a group 100 having only a single TCAM entry 109. As shown, TCAM entry 109 includes stored entry value 101, entry mask 102, and one or more error codes 103 (e.g., error detection such as parity, or an error correction code) protecting value 101 and mask 102. Logic 104 performs the match/partial match detection and error detection based on an input lookup word 108, entry value 101, entry mask 102, and error code 103 to determine indication 105 of whether a hit, suspected hit, or a miss was produced. In one embodiment, logic 104 performs according to the flow diagram of FIG. 2B. The values of entry value 101, entry mask 102, and one or more error codes 103 may be made available for other processing as indicated by entry 106.

In one embodiment, a hit is when all bit positions of a value of an entry not masked by the mask of the entry completely match corresponding bit positions in the lookup word with no error detected on the entry based on said error code associated with the entry. In one embodiment, a suspected hit is when an error is detected on the entry based on the error code associated with the entry and a count of the bits having a value of one in a result of ANDing the mask of the entry with the exclusive-OR result of the value of the entry and the lookup word is less than or equal to k. In one embodiment, if the entry is not a hit or suspected hit, then it is a miss. In some embodiments, the count of ones may just return a zero or non-zero-and-less-than-or-equal-to-k result. That is, the count may not produce a number between 1 and k inclusive, just an indication that the result is between 1 and k inclusive.

An unlimited number of mechanisms can be used for identifying the count of ones, such as logic and/or other mechanisms. For example, Shoham et al, "Error-Protection for Lookup Operations in Content-Addressable Memory Entries," U.S. patent application Ser. No. 10/879,254, filed Jun. 29, 2004, is hereby incorporated by reference in its entirety. Shoham et al. discloses, inter alia, multistage logic and other mechanisms for calculating matches in all bit positions or in all but a predetermined number of bit positions. Additionally, Krishnan et al., "Identifying Content-Addressable Memory Entries Differing From a Lookup Word in Multiple But Less Than a Predetermined Number of Bit Positions," U.S. patent application Ser. No. 11/252,960, filed Oct. 18, 2005, is hereby incorporated by reference in its entirety. Krishnan et al. discloses, inter alia, a mechanism for identifying zero or less than a predetermined number of differences in bit positions.

Figure 1B:
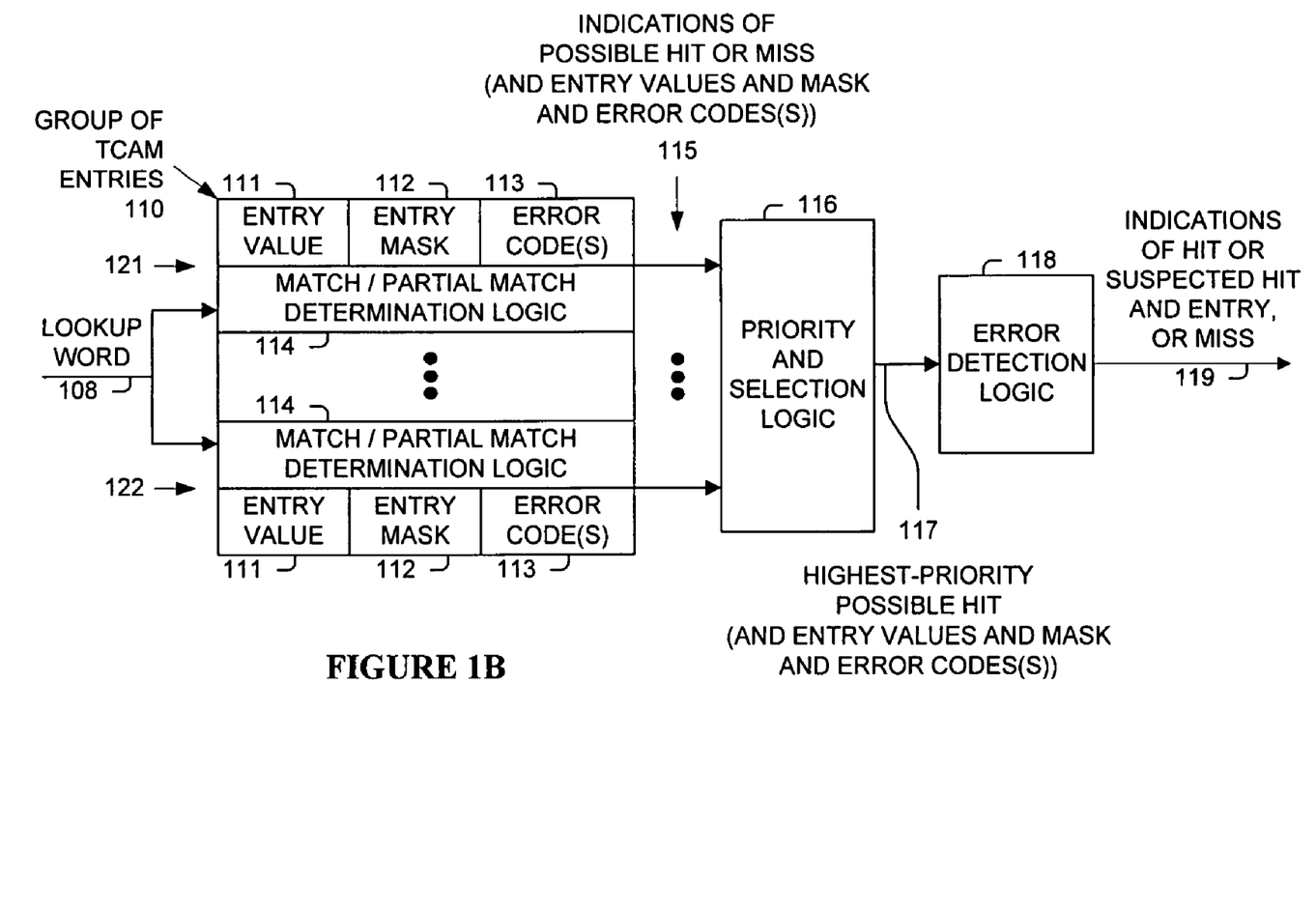

FIG. 1B illustrates a group 110 having multiple TCAM entries 121-122. As shown, each TCAM entry (121-122) includes stored entry value 111, entry mask 112, one or more error codes 113 protecting value 111 and mask 112, and match/partial match determination logic 114. Logic 114 performs, for each of TCAM entries 121-122, the match/partial match determination based on its value 111 and mask 112 to identify a possible hit or a miss with lookup word 108, with indications 115 of these results provided to priority and selection logic 116 to determine the highest priority of the identified possible matching entries.

In one embodiment, a particular entry is a possible hit if k is greater than or equal to a count of the bits having a value of one in a result of ANDing said mask of the particular entry with the exclusive-OR result of said value of the particular entry and the lookup word. Note, if the count of ones between every non-corrupt entry and every other non-corrupted entry in the same group of entries is guaranteed to be more than k, then if there are no bit errors or less than or equal to k bit errors in the values and the masks of all entries within a group, then there will only be a single possible hit (and thus, by default, the highest-priority possible hit) or a miss. If there are more than k total bit errors in the value and mask of any entry, then it is possible to have multiple possible hits, and if so, then one of them is selected and referred to as the highest-priority possible hit.

The highest priority determination is typically predetermined based on a position within a predetermined ordering of the TCAM entries in a group, but also could be determined based on a random or other selection mechanism.

Priority and selection logic 116 identifies and provides an indication 117 of the highest-priority possible hit entry based on indications 115, as well as the value 111, mask 112, and error code 113 of this entry to error detection logic 118. Error detection logic 118 determines whether or not the identified highest-priority possible hit entry is a candidate for being the highest-priority matching entry based on error code 113 associated with the identified highest-priority possible hit entry.

In one embodiment, the highest-priority possible hit entry is a candidate for being the highest-priority matching entry if it is a hit or a suspected hit, else it is not a candidate. In one embodiment, a hit is when all bit positions of the value of the candidate entry not masked by the mask of the candidate entry completely match corresponding bit positions in the lookup word with no error detected on the candidate entry based on the error code associated with the highest-priority candidate entry. In one embodiment, a suspected hit is when an error is detected on the candidate entry based on the error code associated with the highest-priority candidate entry and a count of the bits having a value of one in a result of ANDing the mask of the particular highest-priority possible hit entry with the exclusive-OR result of the value of the particular highest-priority possible hit entry and the lookup word is less than or equal to k. If it is not a hit or suspected hit, then the entry is considered a miss.

Error detection logic 118 identifies whether the highest-priority possible hit 117 is a hit, suspected hit or miss, and signals an indication 119 of such determination, as well as an identification of the entry.

Note, in an embodiment with a single group, then a determined hit or suspected hit corresponds to the highest-priority matching entry. Otherwise, these indications 119 from each of the multiple groups must be analyzed/selected among, such as the manner illustrated in FIG. 1C.

Figure 1C:
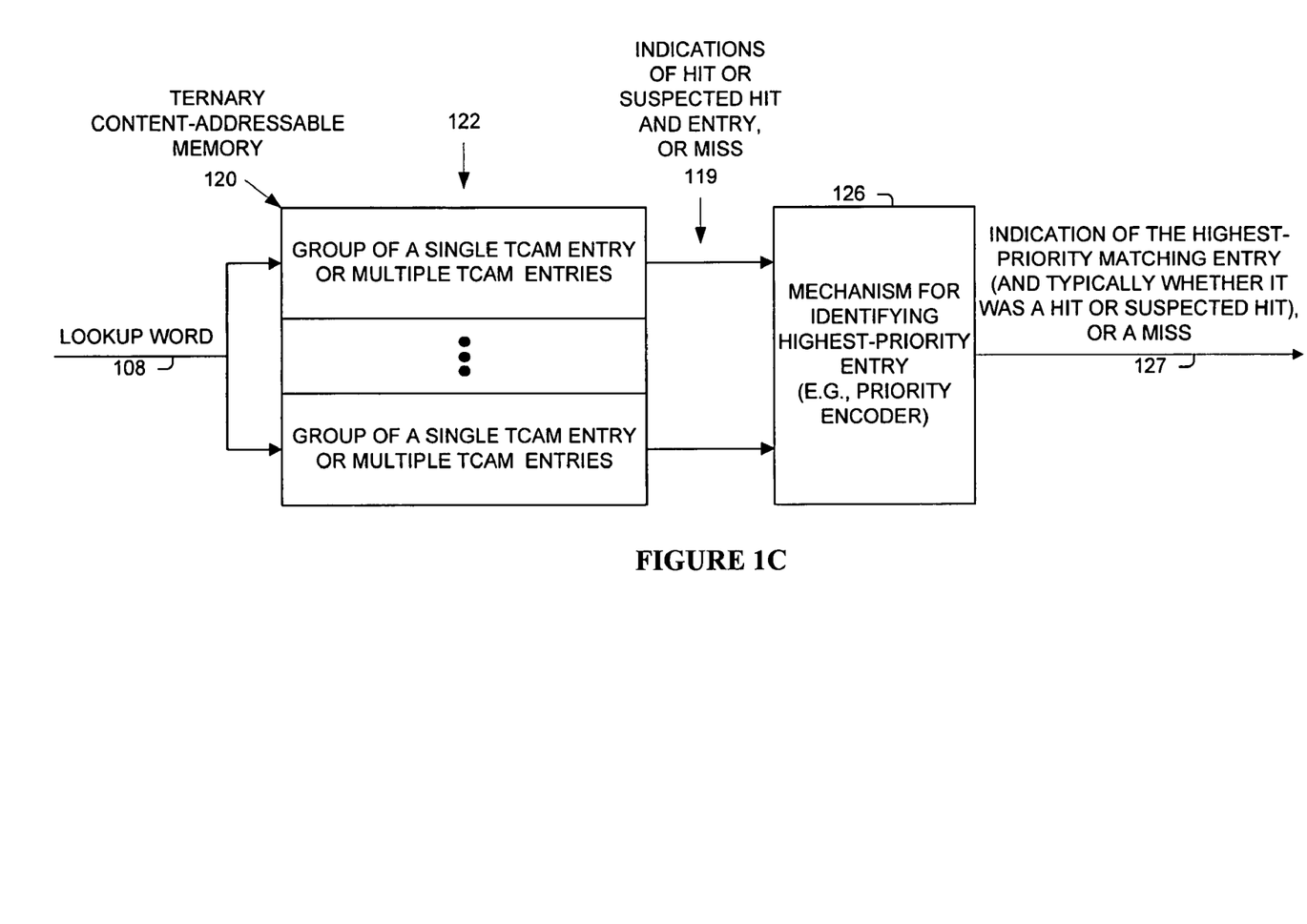

FIG. 1C illustrates a ternary content-addressable memory 120, which refers to one or more groups 122 of TCAM entries, such as, but not limited to, a group 121, 122 (FIG. 1B). Note, TCAM 120 can be in an independent device such as a TCAM chip, a TCAM area of an ASIC, or any other grouping of TCAM entries. Each of the programmed and active groups of entries 122 generates their respective hit or suspected hit and the identification of the entry, or miss indication 119, such as in a manner described in relation to FIGS. 1A, 1B, and/or 2B. Mechanism 126 identifies a highest-priority entry from those groups of entries 122 identifying (119) as being either a hit or suspected hit, and provides an indication of such determination 127, typically identifying either the matching entry and whether it was a hit or suspected hit, or identifying that no entries matched for lookup word 108 (i.e., a miss).

The determination of which of multiple matching entries to select is typically done in a predetermined manner, such as previously done by linearly ordering all of the TCAM entries and selecting the first matching entry in this ordering. In contrast, in one embodiment, a two-key predetermined ordering is used: a first key being the linear ordering position within a group, and the second key being the linear ordering among groups. As similar entries are placed in different groups, this two-key ordering provides additional flexibility for where entries are programmed. There are an unlimited number of selection orderings which can be used. Of course, in applications where the selection order of entries is important (e.g., in a longest prefix match determination), the programming of entries reflects the selection ordering among the TCAM entries and groups of TCAM entries.

Figure 2A:
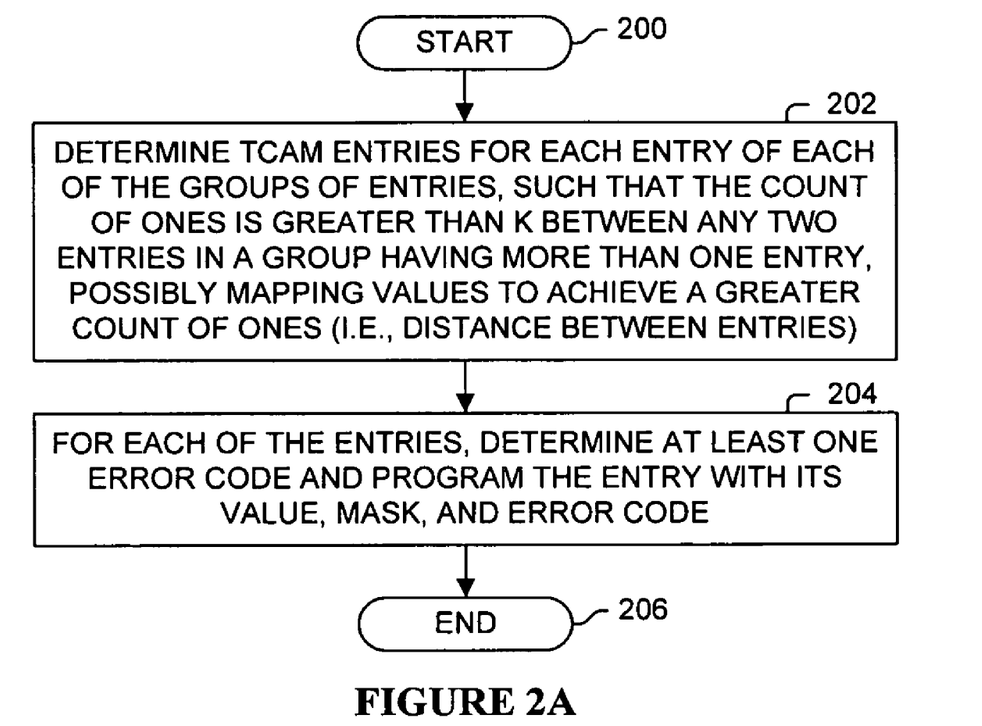
FIGS. 2A-B are flow diagrams illustrating processes used in one embodiment for generating and programming the groups of ternary content-addressable memory entries, and for performing lookup operations thereon.

FIG. 2A illustrates a process used in one embodiment for programming TCAM entries. Processing begins with process block 200, and proceeds to process block 202, wherein the TCAM entries for each entry of each of the groups of entries is determined such that the count of ones is greater than k between any two entries in a group having more than one entry.

This limitation of one embodiment upon the count of ones distance between entries in a group may require a significant number of groups if a large number of similar entries are programmed into the TCAM. It may be possible to reduce this number of groups by mapping some values (e.g., the entire value or one or more portions therein) to another value to create a large distance between two entries which originally could not be programmed into the same group. For example, assume the values of two entries are 1.1.2.3 and 3.1.2.3 (with masks such that no masking is performed). The ones count of each of these will result in a difference of one (e.g., the first field of these two values is 0001 and 0011). For example, by mapping a first field of one into twelve, then these first fields after mapping are 1100 and 0011, which has a difference of four. Typically, k is one or some small number greater than one (e.g., 2, 3). For k=1, the native example values could not be programmed in the same group, while in an embodiment using the mapping, these entries can be programmed into the same group. Note, of course, the lookup word must be mapped in the same manner (i.e., mapping one to twelve for the first field in the example). In one embodiment, this mapping is performed via proper allocation of a portion of the TCAM entry, such as where part of the TCAM entry is an ACL list index, where the list index value can be assigned arbitrarily to ensure that the distance rule is satisfied.

In process block 204, for each of the entries, the error code (e.g., one or more error detection or error correction values) for the value and mask of each of the entries is calculated, and the value, mask and error code is stored in the TCAM entry. For example, in one embodiment, the error code consists of two parity bits, one for value and one for the mask. In one embodiment, the error code consists of a single parity bit for protecting both the value and the mask. The protection mechanism used is extensible, and might be tailored to the implementation technology and its bit error rate characteristics. The error code may protect all or portions of multiple entries. Also, in one embodiment, the error code includes one or more error correcting codes such that not only is it used to detect one or more bit errors, in response to identifying the bit error(s), the TCAM entry is automatically updated to have the correct value, mask, and/or error code.

Processing of the determination and programming of the TCAM entries is complete as indicated by process block 206. Of course, these entries can be updated and/or reprogrammed as needed.

Figure 2B:
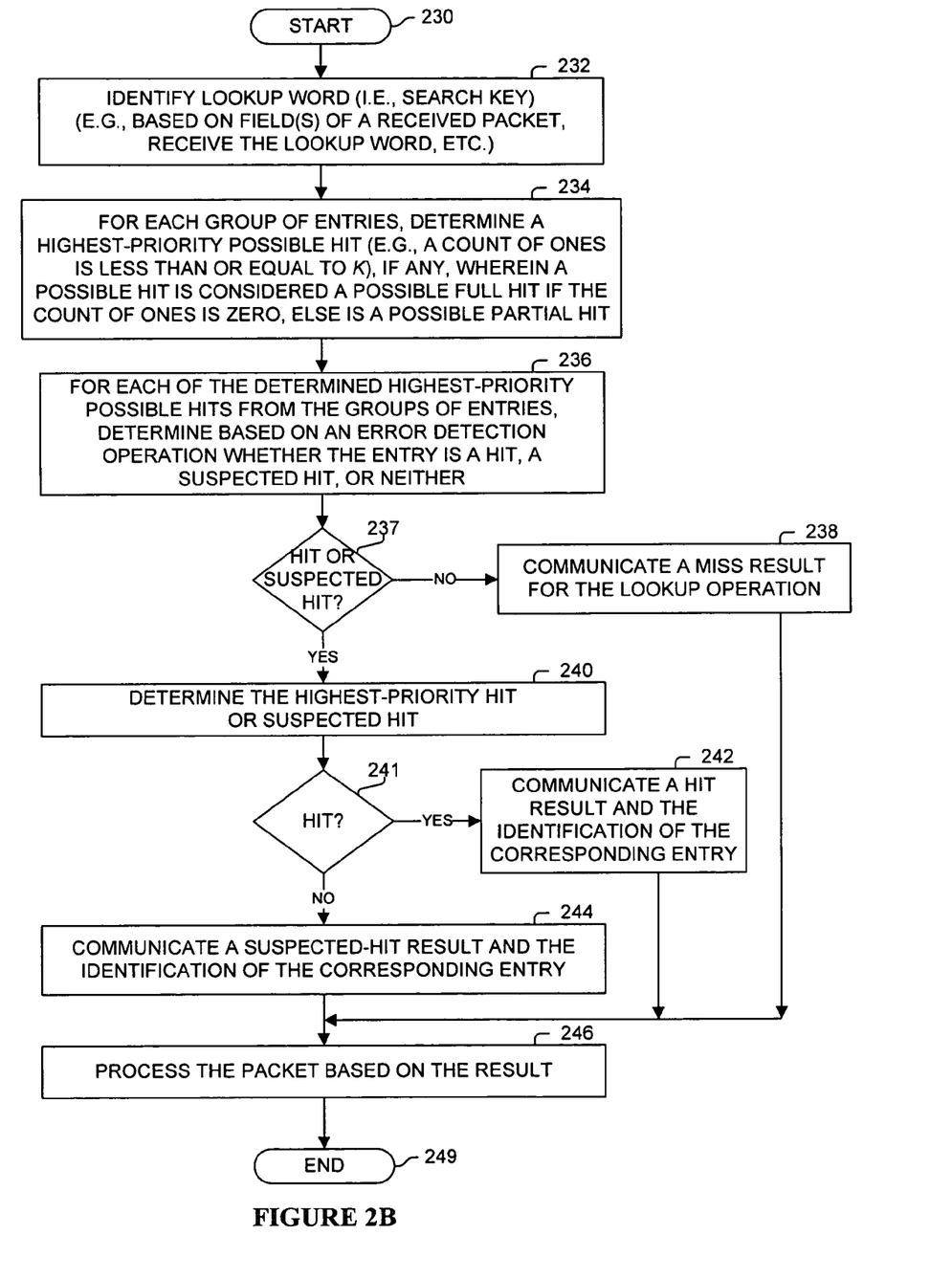

FIG. 2B illustrates a process used in one embodiment for performing lookup operations on groups of TCAM entries. Processing begins with process block 230, and proceeds to process block 232, wherein a lookup word is identified (e.g., received, formed based on one or more fields extracted from a packet, etc.). In process block 234, for each group of entries, a highest-priority possible hit (e.g., a count of ones is less than or equal to k) is determined, if any, wherein a possible hit is considered a possible full hit if the count of ones is zero, else it is a possible partial hit. In process block 236, for each of the determined highest-priority possible hits from the groups of entries, a determination is made based on an error detection operation whether the entry is a hit, a suspected hit, or neither (i.e., a miss).

As determined in process block 237, if there are no hits or suspected hits, then in process block 238, a miss is communicated as the result for the lookup operation. Otherwise, in process block 240, the highest-priority hit or suspected hit is determined from the candidates identified in process block 236. As determined in process block 241, if the highest-priority result is a hit, then in process block 242, the result of a hit and an identification (e.g., group, entry number within group, or some deterministic hashed value, etc.) of the matching entry is communicated as the result for the lookup operation. Otherwise, in process block 244, the result of a suspected hit and an identification of the matching entry is communicated as the result for the lookup operation. In process block 246, some processing is performed based on the result of the lookup operation, such as, but not limited to, the processing of the packet from which the lookup word was derived. Processing is complete as indicated by process block 249.

Figure 3A:
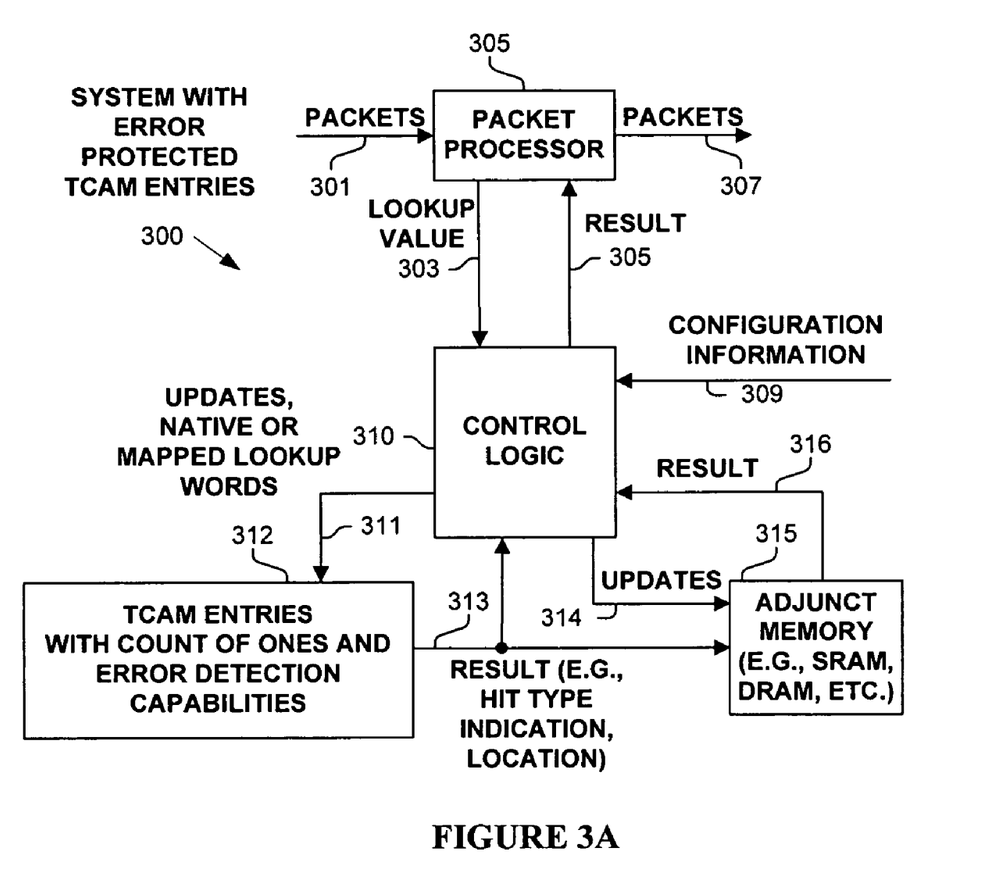
FIGS. 3A-B are block diagrams illustrating a couple of an extensible number of embodiments for performing error-protected ternary content-addressable memory lookup operations.

FIG. 3A illustrates a system 300 using error protected TCAM entries. System 300 programs the TCAM entries and performs lookup operations thereon. System 300 may be, for example, part of a router, communications, computer or any other system or component.

In one embodiment, control logic 310 receives (309) configuration information and programs adjunct memory 315 and TCAM entries 312 (e.g., with values, masks, and error codes; however, in one embodiment, TCAM entries 312 automatically generate the error codes for TCAM entries 312). In one embodiment, control logic 310 includes custom circuitry, such as, but not limited to discrete circuitry, ASICs, memory devices, processors, etc. Control logic 310 also typically stores indications of desired actions to be taken in adjunct memory or memories 315 via updates (314). In one embodiment, control logic 310 includes a memory for storing a second copy of the original, uncorrupted TCAM entries for use in verifying a suspected hit and/or for updated corrupted TCAM entries.

Control logic 310 provides (311) a native or mapped lookup word to TCAM entries 312, which generates result 313 (e.g., an indication of a hit, suspected hit, or miss) that is typically provided to control logic 310 and to adjunct memory or memories 315, which produces result 316. In one embodiment, a single chip or ASIC contains system 300. In one embodiment, a single chip or ASIC contains system 300 except for packet processor 305. In one embodiment, less than all or even no two components of system 300 reside on the same chip or ASIC.

In one embodiment, packets 301 are received by packet processor 305. In addition to other operations (e.g., packet routing, security, etc.), packet processor 305 typically generates lookup value 303 based on the received packet, with this lookup word being provided to control logic 310. Control logic 310 provides (311) a native lookup word or a lookup word with one or more fields mapped to other values consistent with the TCAM entry programming to TCAM entries 312, and initiates one or more lookup operations on protected TCAM entries 312. A result 305 (e.g., a packet classification identification or action) is typically returned to packet processor 305, and in response, one or more of the received packets are manipulated and forwarded as indicated by packets 307.

Figure 3B:
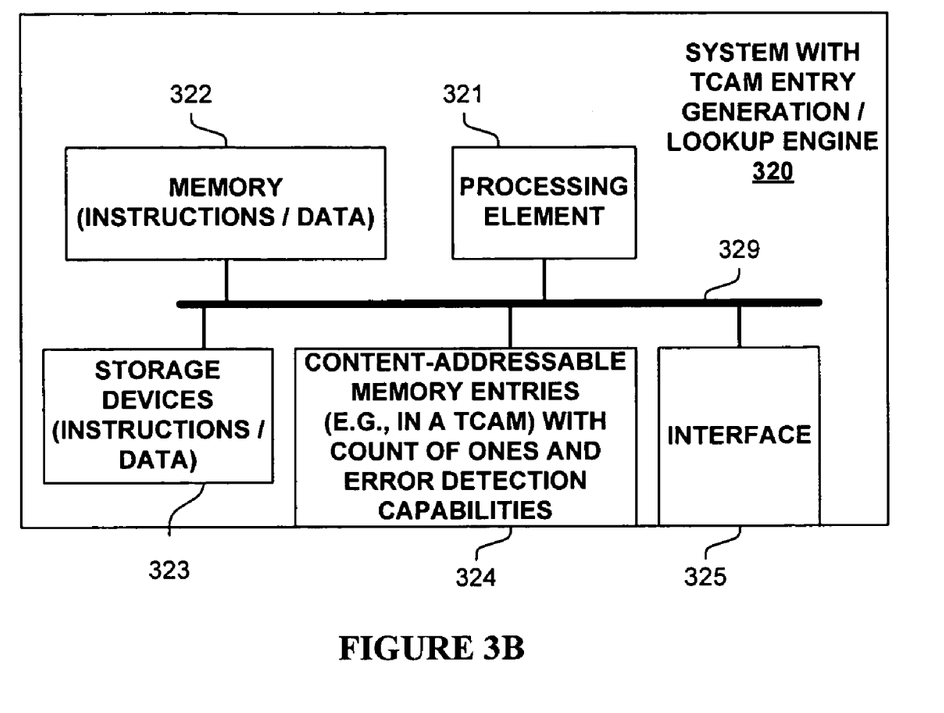

FIG. 3B is a block illustrating a system or component 320 used in one embodiment for generating and/or programming a protected TCAM and performing lookup operations thereon. System 320 may be part of a router, communications, computer or any other system or component. In one embodiment, system 320 performs one or more processes corresponding to one of the diagrams illustrated herein or otherwise described herein.

In one embodiment, system 320 includes a processing element 321, memory 322, storage devices 323, protected TCAM entries 324 (e.g., TCAM entries with count of ones and error detection capabilities as disclosed herein), and an interface 325 for connecting to other devices, which are coupled via one or more communications mechanisms 329 (shown as a bus for illustrative purposes).

Various embodiments of system 320 may include more or less elements. The operation of system 320 is typically controlled by processing element 321 using memory 322 and storage devices 323 to perform one or more tasks or processes, such as programming and performing extended lookup operations using content-addressable memory or memories 324. Memory 322 is one type of computer readable media, and typically comprises random access memory (RAM), read only memory (ROM), flash memory, integrated circuits, and/or other memory components. Memory 322 typically stores computer executable instructions to be executed by processing element 321 and/or data which is manipulated by processing element 321 for implementing functionality in accordance with one embodiment of the invention. Storage devices 323 are another type of computer readable media, and typically comprise solid state storage media, disk drives, diskettes, networked services, tape drives, and other storage devices. Storage devices 323 typically store computer executable instructions to be executed by processing element 321 and/or data which is manipulated by processing element 321 for implementing functionality in accordance with one embodiment of the invention.

In one embodiment, processing element 321 programs and performs lookup operations on TCAM entries 324, to generate lookup results, which are received and used by processing element 321 and/or communicated to other devices via interface 325.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. A method for identifying a highest-priority matching entry in a ternary content-addressable memory, the ternary content-addressable memory includes a plurality of entries, each of the plurality of entries includes a value and a mask and is associated with at least one error code; the plurality of entries comprises a plurality of groups of said entries, with all entries in each of said groups differing in a count of ones from each other entry in the same group by more than k, wherein k is an integer greater than zero, the method comprising:

for each particular group of said groups of entries, determining a highest-priority possible hit entry in said particular group, if any, for a lookup word;

for each particular highest-priority possible hit entry of said determined highest-priority possible hit entries, determining whether or not said particular highest-priority possible hit entry is a candidate for being the highest-priority matching entry based on said error code associated with said particular highest-priority possible hit entry; and determining a highest-priority candidate entry from said determined candidate entries.

2. The method of claim 1, wherein said error code is an error-correcting code.

3. The method of claim 1, wherein said error code is parity.

4. The method of claim 1, wherein each of said group of entries comprises a single different one of said entries.

5. The method of claim 1, wherein each of said groups of entries includes a plurality of entries such that no entry of said entries is in more than one of said groups of entries.

6. The method of claim 1, wherein k is one.

7. The method of claim 1, wherein k is greater than one.

8. The method of claim 1, wherein the count of ones between two entries is determined based on a count of the bits having a value of one in a result of ANDing the exclusive-OR result of said values of said two entries with the result of ANDing said masks of said two entries.

9. The method of claim 1, wherein a particular entry is a possible hit entry if k is greater than or equal to a count of the bits having a value of one in a result of ANDing said mask of the particular entry with the exclusive-OR result of said value of the particular entry and the lookup word.

10. The method of claim 1, including communicating an indication of said determined highest-priority matching entry and an indication of whether said determined highest-priority matching entry was determined to be a hit or a suspected hit.

11. The method of claim 1, wherein said particular highest-priority possible hit entry is a candidate for being the highest-priority matching entry if it is a hit or a suspected hit, else it is not a candidate.

12. The method of claim 11, wherein a hit is when all bit positions of said value of the said particular highest-priority possible hit entry not masked by said mask of the said particular highest-priority possible hit entry completely match corresponding bit positions in the lookup word with no error detected on said particular highest-priority possible hit entry based on said error code associated with said particular highest-priority possible hit entry, and wherein a suspected hit is when an error is detected on said particular highest-priority possible hit entry based on said error code associated with said particular highest-priority possible hit entry and a count of the bits having a value of one in a result of ANDing said mask of said particular highest-priority possible hit entry with the exclusive-OR result of said value of said particular highest-priority possible hit entry and the lookup word is less than or equal to k.

13. The method of claim 1, including determining the placement of entries in the ternary content-addressable memory in order to guarantee that all said entries in each particular group of the plurality of groups of said entries which includes a plurality of entries differ in a count of ones from every other entry in the particular group by more than k.

14. The method of claim 13, including mapping original values for one or more of said entries in a specific group of said groups of entries into said values for said one or more of said entries in the specific group in order to change the count of ones between at least two of said entries in the specific group.

15. The method of claim 1, comprising: determining the lookup word based on one or more fields of a received packet; and processing said received packet based on said highest-priority matching entry determined based on the lookup word.

16. An apparatus configured to identify a highest-priority matching entry, the apparatus comprising:
a plurality of groups of ternary content-addressable memory entries, each of said entries includes a value, a mask and at least one error code;
logic configured to perform a lookup operation on said groups of ternary content-addressable memory entries based on a lookup word to determine the highest-priority matching entry;
wherein said lookup operation includes: (a) for each particular group of said groups of entries, determining a highest-priority possible hit entry in said particular group, if any, for the lookup word; (b) for each particular highest-priority possible hit entry of said determined highest-priority possible hit entries, determining whether or not said particular highest-priority possible hit entry is a candidate for being the highest-priority matching entry based on said error code of said particular highest-priority possible hit entry, wherein said particular highest-priority possible hit entry is a candidate for being the highest-priority matching entry if it is a hit or a suspected hit, else it is not a candidate; and (c) determining a highest-priority candidate entry from said determined candidate entries.

17. The apparatus of claim 16, wherein all entries in each of said groups of ternary content-addressable memory entries having more than one entry differ in a count of ones from each other by more than k, wherein k is an integer greater than zero.

18. The apparatus of claim 17, comprising means for programming all entries in each of said groups having more than one entry to guarantee a difference in a count of ones from each other by more than k, wherein the count of ones between two entries is determined based on a count of the bits having a value of one in a result of ANDing the exclusive-OR result of said values of the two entries with the result of ANDing said masks of the two entries.

19. The apparatus of claim 16, wherein a hit is when all bit positions of said value of the said candidate entry not masked by said mask of the said candidate entry completely match corresponding bit positions in the lookup word with no error detected on said candidate entry based on said error code associated with the highest-priority candidate entry, wherein a suspected hit is when an error is detected on said candidate entry based on said error code associated with the highest-priority candidate entry and a count of the bits having a value of one in a result of ANDing said mask of said particular highest-priority possible hit entry with the exclusive-OR result of said value of said particular highest-priority possible hit entry and the lookup word being less than or equal to k, wherein k is an integer greater than zero.

20. The apparatus of claim 16, wherein each of said group of entries comprises a single different one of said entries.

21. The apparatus of claim 16, wherein each of said groups of entries includes a plurality of entries such that no entry of said entries is in more than one of said groups of entries.

22. The apparatus of claim 16, wherein a particular entry is a possible hit entry if k is greater than or equal to a count of the bits having a value of one in a result of ANDing said mask of the particular entry with the exclusive-OR result of said value of the particular entry and the lookup word, wherein k is an integer greater than zero.

23. The apparatus of claim 16, including means for communicating an indication of said determined highest-priority matching entry and an indication of whether said determined highest-priority matching entry was determined to be a hit or a suspected hit.

* * * * *